(12) United States Patent
Fujikawa et al.

(10) Patent No.: US 11,618,969 B2
(45) Date of Patent: Apr. 4, 2023

(54) SIC SINGLE CRYSTAL COMPOSITE AND SIC INGOT

(71) Applicants: SHOWA DENKO K.K., Tokyo (JP); DENSO CORPORATION, Kariya (JP)

(72) Inventors: Yohei Fujikawa, Hikone (JP); Hideyuki Uehigashi, Kariya (JP)

(73) Assignees: SHOWA DENKO K.K., Tokyo (JP); DENSO CORPORATION, Kariya (JP)

( * ) Notice: Subject to any disclaimer, the term of this patent is extended or adjusted under 35 U.S.C. 154(b) by 658 days.

(21) Appl. No.: 16/349,418

(22) PCT Filed: Nov. 14, 2017

(86) PCT No.: PCT/JP2017/040896
§ 371 (c)(1),
(2) Date: May 13, 2019

(87) PCT Pub. No.: WO2018/092756
PCT Pub. Date: May 24, 2018

(65) Prior Publication Data
US 2019/0360118 A1 Nov. 28, 2019

(30) Foreign Application Priority Data
Nov. 15, 2016 (JP) .............................. JP2016-222273

(51) Int. Cl.
*C30B 29/36* (2006.01)
*C01B 32/956* (2017.01)
*C30B 23/02* (2006.01)

(52) U.S. Cl.
CPC ............ *C30B 29/36* (2013.01); *C01B 32/956* (2017.08); *C30B 23/02* (2013.01)

(58) Field of Classification Search
None
See application file for complete search history.

(56) References Cited

U.S. PATENT DOCUMENTS

| | | | | |
|---|---|---|---|---|
| 2015/0275397 | A1* | 10/2015 | Gunjishima | .......... C30B 23/025 117/63 |
| 2018/0355511 | A1* | 12/2018 | Shonai | ................... C30B 23/02 |

FOREIGN PATENT DOCUMENTS

| | | |
|---|---|---|
| JP | 11-268989 A | 10/1999 |
| JP | 2001-294499 A | 10/2001 |
| JP | 2002-060297 A | 2/2002 |
| JP | 2003-527298 A | 9/2003 |
| JP | 2013-166672 A | 8/2013 |

(Continued)

OTHER PUBLICATIONS

International Search Report for PCT/JP2017/040896 dated Jan. 30, 2018 [PCT/ISA/210].

*Primary Examiner* — Guinever S Gregorio
(74) *Attorney, Agent, or Firm* — Sughrue Mion, PLLC (57) ABSTRACT

A SiC single crystal composite includes: a central portion positioned at a center in plan view; and an outer circumferential portion surrounding an outer circumference of the central portion, in which crystal planes of the central portion and the outer circumferential portion are inclined to each other or different from each other, a boundary is present between the central portion and the outer circumferential portion, and a direction of a crystal constituting the central portion and a direction of a crystal constituting the outer circumferential portion are different from each other via the boundary.

1 Claim, 5 Drawing Sheets

(56) References Cited

FOREIGN PATENT DOCUMENTS

| JP | 2013-237592 A | 11/2013 |
|---|---|---|
| WO | 01/68957 A1 | 9/2001 |

* cited by examiner

SIC SINGLE CRYSTAL COMPOSITE AND SIC INGOT

CROSS REFERENCE TO RELATED APPLICATIONS

This application is a National Stage of International Application No. PCT/JP2017/040896, filed on Nov. 14, 2017, which claims priority from Japanese Patent Application No. 2016-222273, filed on Nov. 15, 2016, the content of which is incorporated herein by reference.

TECHNICAL FIELD

The present invention relates to a SiC single crystal composite and a SiC ingot.

BACKGROUND ART

Silicon carbide (SiC) has a dielectric breakdown field larger by one order of magnitude and a band gap three times larger than those of silicon (Si). In addition, silicon carbide (SiC) has characteristics such that the thermal conductivity is approximately three times higher than that of silicon (Si). Application of silicon carbide (SiC) to power devices, high-frequency devices, high-temperature operation devices, and the like is expected.

A SiC wafer is produced by cutting a SiC ingot. In recent years, there has been a demand for an increase in the diameter of a SiC wafer for growing a SiC epitaxial film. Therefore, there is an increasing demand for an increase in the diameter and length of the SiC ingot itself. For example, Patent Document 1 describes a single crystal growth apparatus provided with a tapered guide member for increasing the diameter of a SiC single crystal.

However, when a single crystal grown from a seed crystal and a polycrystal grown on the guide member come into contact with each other, the contact causes defects, polytype inclusions, cracks, and the like, and there are cases where the quality of the SiC ingot deteriorates.

In order to avoid such a problem, in Patent Document 2, a tapered guide member is maintained at a high temperature to suppress crystal growth of polycrystalline SiC on the surface of the guide member.

CITATION LIST

Patent Literature

[Patent Document 1] Japanese Unexamined Patent Application, First Publication No. 2002-60297
[Patent Document 2] Japanese Unexamined Patent Application, First Publication No. 2013-166672

SUMMARY OF INVENTION

Technical Problem

However, in the method described in Patent Document 2, a treatment such as heating the guide member is necessary, so that a simpler method has been required.

The present invention has been made taking the foregoing problems into consideration, and an object thereof is to provide a SiC single crystal composite and a SiC ingot which can provide a high-quality SiC wafer.

Solution to Problem

As a result of intensive investigations, the present inventors found that by changing the crystal state between a central portion and an outer circumferential portion in plan view, the intrusion of a defect generated by contact with a polycrystal into the central portion used for a SiC wafer can be prevented and thus a high-quality SiC wafer can be obtained. That is, the present invention provides the following features in order to solve the above problems.

(1) According to an aspect of this embodiment, a SiC single crystal composite includes: a central portion positioned at a center in plan view; and an outer circumferential portion surrounding an outer circumference of the central portion, in which crystal planes of the central portion and the outer circumferential portion are inclined to each other or different from each other, and a boundary is present between the central portion and the outer circumferential portion, and a direction of a crystal constituting the central portion and a direction of a crystal constituting the outer circumferential portion are different from each other via the boundary.

(2) In the SiC single crystal composite according to the aspect, a crystal growth surface of the central portion may have an offset angle of 2° or more and 20° or less with respect to a {0001} plane.

(3) In the SiC single crystal composite according to the aspect, at an intersection between a straight line passing through the center in parallel to an offset direction during crystal growth and the boundary, the crystal planes of the central portion and the outer circumferential portion may be inclined to each other by 2° or more with a direction perpendicular to boundary planes of the central portion and the outer circumferential portion while using the direction as an axis.

(4) In the SiC single crystal composite according to the aspect, the crystal plane of the central portion may be a (000-1) C plane, and the crystal plane of the outer circumferential portion may be a (0001) Si plane.

(5) In the SiC single crystal composite according to the aspect, the boundary may be provided inward of 5% or more of a diameter of the SiC single crystal composite from an outer circumferential end of the SiC single crystal composite.

(6) According to another aspect of the present invention, a SiC ingot includes: a first single crystal positioned at a center in plan view; a second single crystal surrounding an outer circumference of the first single crystal; and a joint portion connecting the first single crystal to the second single crystal, in which a direction of a crystal constituting the first single crystal and a direction of a crystal constituting the second single crystal are different from each other with the joint portion as a boundary.

(7) In the SiC ingot according to the aspect, the first single crystal and the second single crystal may be different from each other in polytype.

Advantageous Effects of Invention

According to the SiC single crystal composite of the aspect of the present invention, a predetermined SiC ingot can be obtained, and a high-quality SiC wafer can be obtained.

BRIEF DESCRIPTION OF DRAWINGS

FIG. 1 is a schematic view
FIG. 1(a) is a schematic sectional view and FIG. 1(b) is a schematic plan view of a SiC single crystal composite according to an aspect of the present invention.

DESCRIPTION OF EMBODIMENTS

Hereinafter, a SiC single crystal composite and a SiC ingot to which the present invention is applied will be described in detail with reference to the drawings as appropriate. In the drawings used in the following description, there are cases where characteristic portions are enlarged for convenience, and the dimensional ratio and the like of each constituent element may be different from reality. The materials, dimensions, and the like shown in the following description are merely examples, and the present invention is not limited thereto and can be embodied in appropriately modified manners in a range that does not change the gist thereof.

Figure 1:
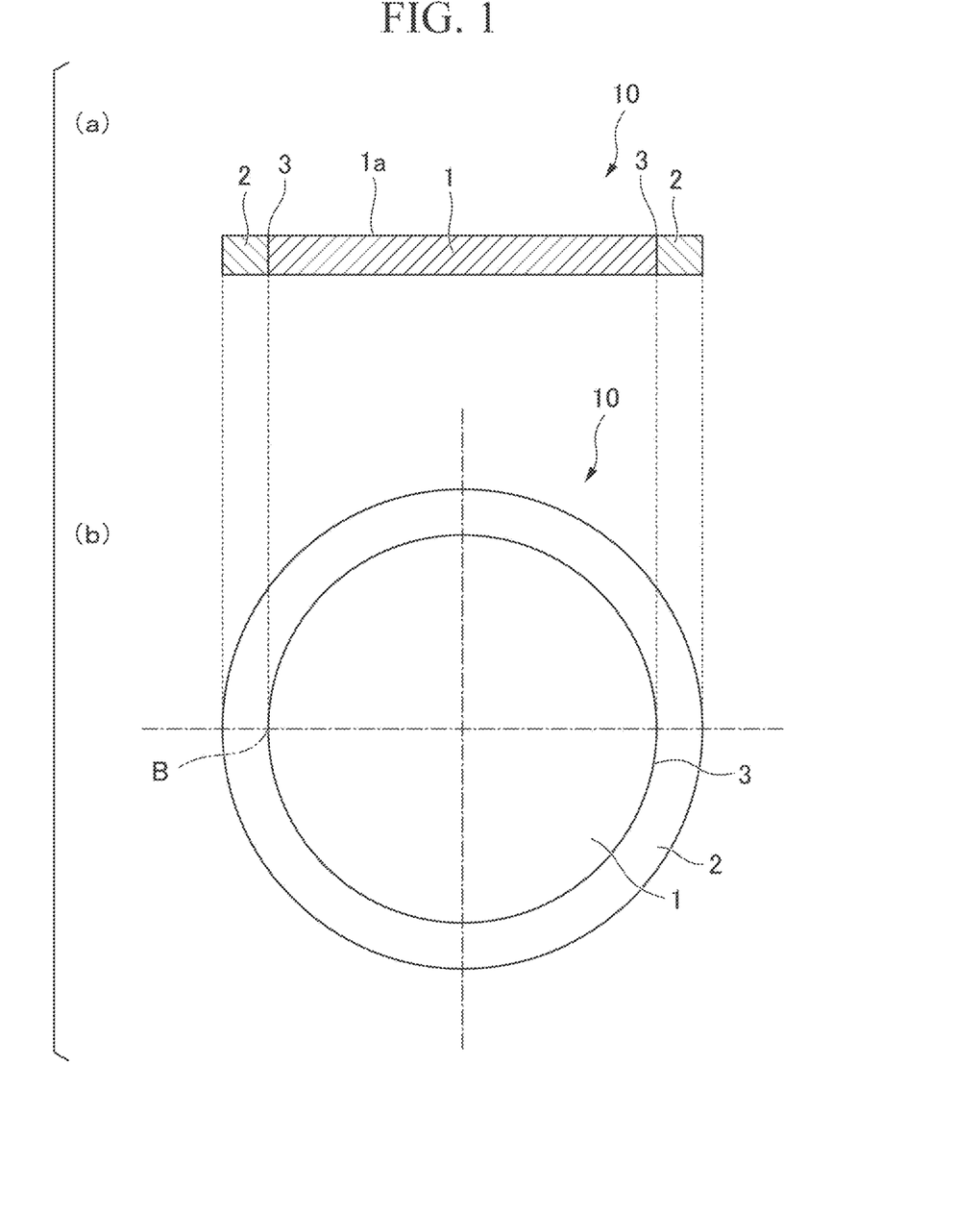

FIG. 1 is a schematic view of a SiC single crystal composite 10 according to an aspect of the present invention. (a) of FIG. 1 is a schematic sectional view, and (b) of FIG. 1 is a schematic plan view.

As illustrated in FIG. 1, the SiC single crystal composite 10 includes a central portion 1 positioned at the center in plan view and an outer circumferential portion 2 surrounding the outer circumference of the central portion 1. A boundary 3 is formed between the central portion 1 and the outer circumferential portion 2.

It is preferable that a crystal growth surface 1a of the central portion 1 have an offset angle of 2° or more and 20° or less with respect to the {0001} plane. That is, it is preferable that the {0001} plane, which is a crystal plane of the central portion 1, have an inclination with respect to the crystal growth surface 1a. Here, the {0001} plane is a plane including a (000-1) C plane and a (0001) Si plane and is a plane orthogonal to a <0001> direction (c-axis direction). This plane is sometimes referred to as a c-plane.

In this specification, the "offset angle" refers to an angle between a normal vector of the crystal growth surface 1a and a normal vector of the {0001} plane. In addition, "offset upstream" refers to a direction in which the tip of a vector obtained by projecting the normal vector of the {0001} plane on the crystal growth surface 1a is directed, and "offset downstream" refers to a direction opposite to the offset upstream. Furthermore, the "crystal plane" refers to a plane defined by the Miller index of a crystal, and the "crystal growth surface" refers to a face exposed to the surface when a SiC ingot is produced, and one face of the SiC single crystal composite 10.

In a case of producing a SiC ingot on the crystal growth surface of the SiC single crystal composite 10, SiC undergoes step-flow growth. In the step-flow growth, the SiC ingot grows in a c-plane direction as a whole while a crystal grows in an a-plane direction. Therefore, defects and dislocations generated on the offset upstream side can be caused to flow out to the offset downstream side. Therefore, defects and crystal dislocations generated in the crystal growth process can be caused to flow out to the outside, thereby obtaining a high-quality SiC ingot.

The offset angle of the crystal growth surface 1a with respect to the {0001} plane is 2° or more and 20° or less, and preferably 3° or more and 9° or less. When the offset angle is too small, it is difficult for defects to flow to the offset downstream side. When the defects do not flow to the offset downstream side and stay at the same place, the defects are less likely to decrease during the growth. Furthermore, when the offset angle is too small, crystal growth proceeds in the c-axis direction, and polytype inclusions tend to be generated.

On the other hand, when the offset angle is too large, stress is applied in a c-plane slip direction (a direction parallel to the {0001} plane) due to a temperature gradient, and basal plane dislocations are likely to be generated. In addition, the difference from an offset angle (typically 4° or less) of a SiC wafer used for manufacturing a device or the like increases. Therefore, it is necessary to obliquely cut the SiC wafer from the SiC ingot, so that the number of SiC wafers to be obtained is reduced.

The crystal planes of the central portion 1 and the outer circumferential portion 2 are inclined with each other or different from each other, and the direction of the crystal constituting the central portion 1 and the direction of the crystal constituting the outer circumferential portion 2 are different from each other via the boundary 3. The boundary 3 is the interface between the central portion 1 and the outer circumferential portion 2. Even in a case where the central portion 1 and the outer circumferential portion 2 are joined, the central portion 1 and the outer circumferential portion 2 are not continuous as crystals. That is, the boundary 3 is crystallographically close to a crystal grain boundary and corresponds to a region where the atomic arrangement is disturbed.

A single crystal that grows from the central portion 1 and a single crystal that grows from the outer circumferential portion 2 are not integrated with each other. In this specification, "integration" and "joining" are not synonymous. "Integration" means "joining without disturbance of crystal arrangement", and "joining" means "a state where crystals are connected without gaps such as spatial voids therebetween". That is, "joining" is a broader concept and "integration" indicates a state in which crystal arrangements are also connected among the states of "joining". Therefore, in a case where a boundary remains after crystal growth, it can be said that the crystals are not integrated. The boundary can be confirmed by, for example, a microscopic image after surface etching.

Figure 2:
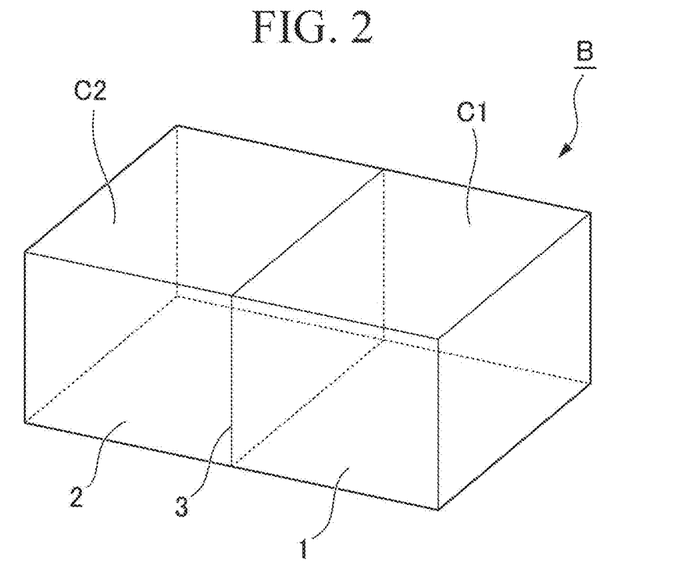
FIG. 2 is a view schematically illustrating the vicinity of a boundary between a central portion and an outer circumferential portion in a case where the crystal planes of the central portion and the outer circumferential portion are different from each other.

First, a case where the crystal planes of the central portion 1 and the outer circumferential portion 2 are different from each other will be described. FIG. 2 is a view schematically illustrating the vicinity of a boundary B in FIG. 1 in the case where the crystal planes of the central portion 1 and the outer circumferential portion 2 are different from each other. That is, FIG. 2 is an enlarged view of a portion of the boundary 3 between the central portion 1 and the outer circumferential portion 2.

In FIG. 2, a crystal plane C1 of the central portion 1 and a crystal plane C2 of the outer circumferential portion 2 are parallel to each other. On the other hand, the crystal planes C1 and C2 have different plane indices.

As an example of the case where the crystal planes of the central portion 1 and the outer circumferential portion 2 are different from each other, there is a case where the crystal plane C1 of the central portion 1 is a (000-1) C plane and the crystal plane C2 of the outer circumferential portion 2 is a (0001) Si plane. The C plane and the Si plane may each have an offset angle of 20° or less, and may have an offset angle of 9° or less.

A SiC single crystal has polar planes called a Si plane ((0001) Si plane) and a C plane ((000-1) C plane), and the polar planes have different physical properties due to the difference in dangling bond. The polar plane refers to a plane where the probability of exposure of atoms constituting a semiconductor (Si and C in the case of SiC) from the surface of a substrate is not the same regarding an ideal plane having no defect or the like. That is, on the C plane in a SiC substrate, the C plane is primarily exposed from the surface of the substrate, and the probability of exposure of C is higher than that of Si, whereas on the Si plane, the Si plane is primarily exposed from the surface of the substrate, and the probability of exposure of Si is higher than that of C.

In the SiC single crystal, layers of silicon atoms and layers of carbon atoms are alternately stacked in the <0001> direction. Therefore, the order of the layers of silicon atoms and the layers of carbon atoms is reversed between a first single crystal grown on the (000-1) C plane and a second single crystal grown on the (0001) Si plane. Therefore, on the boundary portion 3, a joint portion that connects the first single crystal to the second single crystal is present as a grain boundary, and the crystals are not integrated with each other.

Furthermore, in a case where the crystal plane is the (000-1) C plane, a single crystal having 4H—SiC and 6H—SiC polytypes grows, and when the crystal growth surface is 4H, 4H—SiC is dominantly generated. Contrary to this, in a case where the crystal plane is the (0001) Si plane, 6H—SiC is dominantly generated although 15R—SiC is mixed therein.

Therefore, 4H—SiC grows on the crystal plane C1 of the (000-1) C plane, and 6H—SiC grows on the crystal plane C2 of the (0001) Si plane. That is, the first single crystal grown on the (000-1) C plane and the second single crystal grown on the (0001) Si plane are also different from each other in polytype.

Although the description has been made based on the case of the (000-1) C plane and the (0001) Si plane as an example of the case where the crystal planes of the central portion 1 and the outer circumferential portion 2 are different from each other, the crystal planes are not limited to this case.

For example, there is a case where the crystal plane C1 of the central portion 1 is (0001) and the crystal plane C2 of the outer circumferential portion 2 is (1-10x), and there is a case where the crystal plane C1 of the central portion 1 is (0001) and the crystal plane C2 of the outer circumferential portion 2 is (11-2x) (x is an integer).

In either case, since the crystal planes are different from each other, a joint portion remains as a grain boundary between the first single crystal that grows from the central portion 1 and the second single crystal that grows from the outer circumferential portion 2. That is, the direction of the crystal constituting the first single crystal and the direction of the crystal constituting the second single crystal are different from each other, and the crystals are not integrated with each other.

Figure 3:
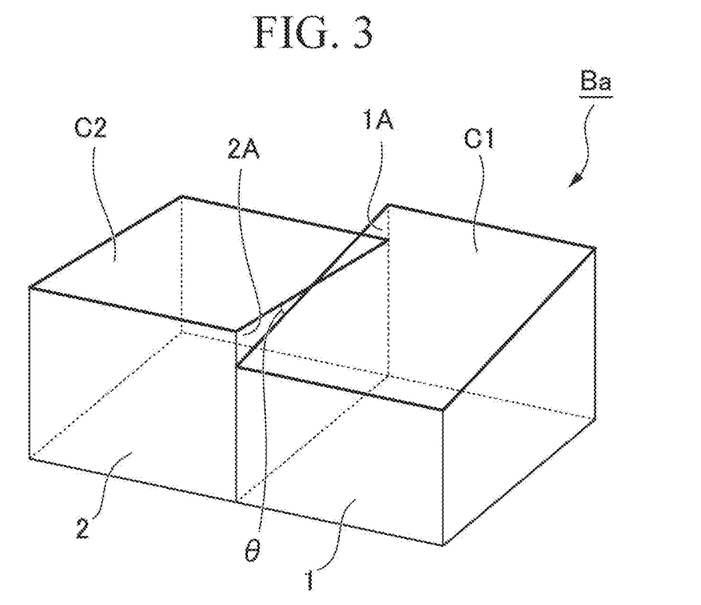
FIG. 3 is a view schematically illustrating the vicinity of a boundary between the central portion and the outer circumferential portion in a case where the crystal planes of the central portion and the outer circumferential portion are inclined to each other.

Next, a case where the crystal planes of the central portion 1 and the outer circumferential portion 2 are inclined to each other will be described. FIG. 3 is an enlarged view of the vicinity of a boundary Ba which is a portion of the boundary 3 between the central portion 1 and the outer circumferential portion 2 in the case where the crystal planes of the central portion 1 and the outer circumferential portion 2 are inclined to each other.

In FIG. 3, the crystal plane C1 of the central portion 1 and the crystal plane C2 of the outer circumferential portion 2 have the same plane index.

On the other hand, the crystal plane C1 and the crystal plane C2 are inclined to each other by an inclination angle θ with a direction perpendicular to a boundary plane 1A and a boundary plane 2A while using the direction as the axis.

Generally, when crystals are grown on crystal planes having the same plane index, the crystals are integrated with each other so that the interface between the crystals is not observed. However, when the inclination angle θ becomes 2° or more, strain (disturbance) of the crystal cannot be relieved in the crystal growth process, and the crystals are not integrated with each other.

Figure 4:
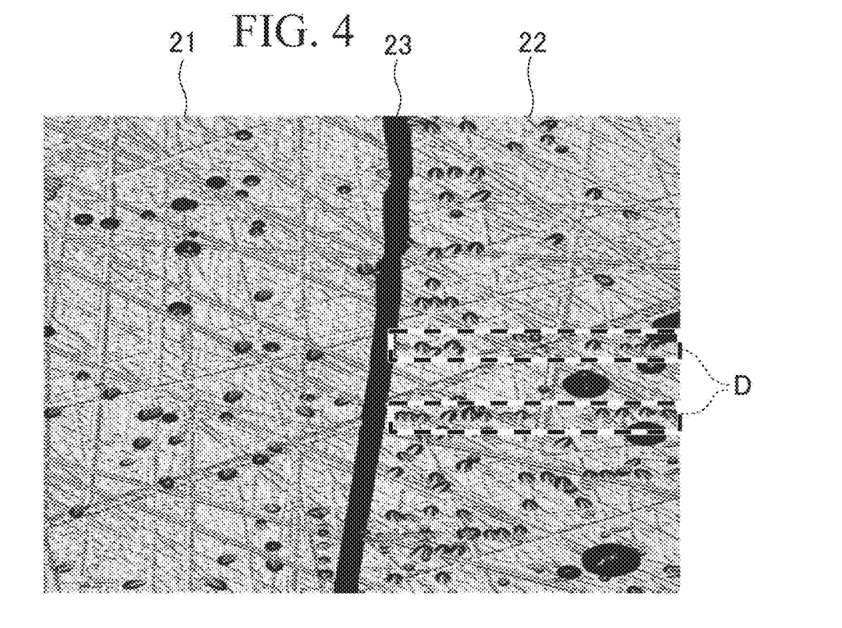
FIG. 4 is a microscopic image of a boundary portion of a surface of a SiC wafer, subjected to etching with molten KOH, the SiC wafer being obtained by growing SiC on a SiC single crystal composite in which the crystal plane of the outer circumferential portion is inclined by 8° with respect to the crystal plane of the central portion.

For example, FIG. 4 is a microscopic image of a SiC wafer obtained by growing SiC on a SiC single crystal composite in which the crystal plane C2 of the outer circumferential portion 2 is inclined by 8° with respect to the crystal plane C1 of the central portion 1. The crystal grown on the central portion 1 is a first single crystal 21, and the crystal grown on the outer circumferential portion 2 is a second single crystal 22. FIG. 4 is an image obtained by etching the surface of the SiC wafer and photographing the surface with a microscope.

As shown in FIG. 4, a clear joint portion 23 is confirmed between the first single crystal 21 and the second single crystal 22. The direction of the crystal constituting the first single crystal 21 and the direction of the crystal constituting the second single crystal 22 are different from each other via the joint portion 23. Therefore, the joint portion 23 is crystallographically close to a crystal grain boundary and corresponds to a region where the atomic arrangement is disturbed. Therefore, although the first single crystal 21 and the second single crystal 22 are joined to each other, the first single crystal 21 and the second single crystal 22 are not integrated with each other as crystals.

Figure 5:
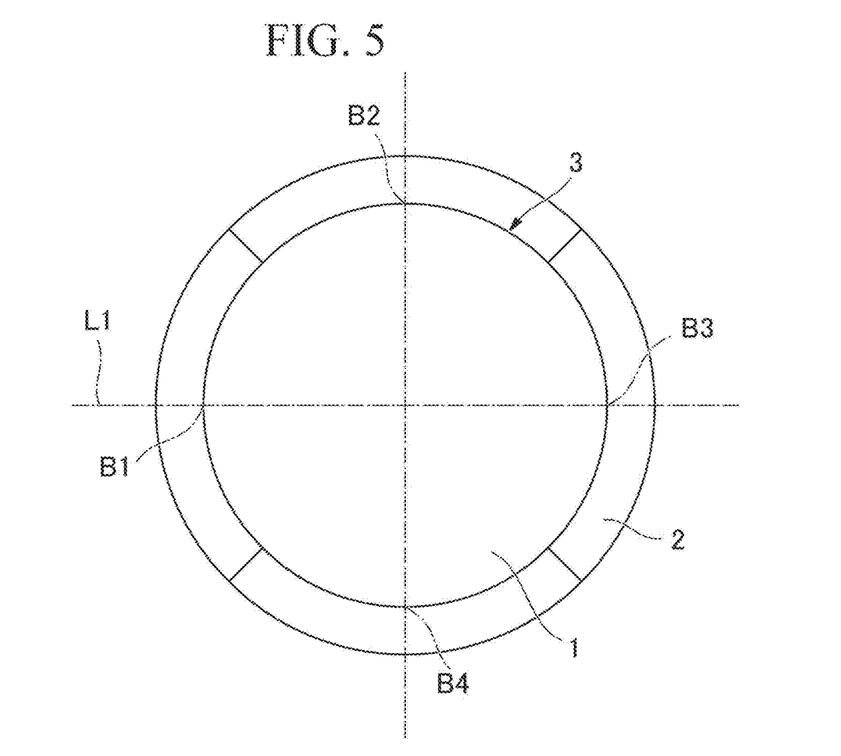
FIG. 5 is a plan view of another example of the SiC single crystal composite according to this embodiment.

FIG. 5 is a plan view of another example of the SiC single crystal composite according to this embodiment. As illustrated in FIG. 5, in a case where the central portion 1 is circular, it is difficult to apply an inclination angle θ between the crystal plane of the central portion 1 and the crystal plane of the outer circumferential portion 2 as illustrated in FIG. 3 at all points of the circular boundary portion 3 between the central portion 1 and the outer circumferential portion 2.

For example, when an inclination angle θ with the direction perpendicular to the boundary plane 1A and the boundary plane 2A as the axis is applied to intersections B1 and B3 where a straight line passing through the center of the SiC single crystal in parallel to the offset direction and the boundary 3 intersects, the inclination directions change at the other intersections B2 and B4, so that the inclination angle θ with the direction perpendicular to the boundary planes 1A and 2A as the axis is not applied.

In this case, it is preferable that the inclination angle θ have a predetermined relationship at least at the intersections B1 and B3 between a straight line L1 passing through the center in parallel to the offset direction during crystal growth and the boundary 3.

Defects generated during the crystal growth of the SiC single crystal composite flow from the offset upstream side to the downstream side. Therefore, the crystals are not continuously connected to each other (not integrated with each other) at the intersections B1 and B3, so that defects and dislocations generated in the outer circumferential portion 2 can be prevented from propagating to the central portion 1.

At this time, the inclination angle θ is preferably 2° or more, more preferably 4° or more, and even more preferably 8° or more. The upper limit thereof may be 180° or less so that the crystal plane of the central portion can be the C plane and the crystal plane of the outer circumferential portion can be the Si plane.

In addition, as illustrated in FIG. 5, it is preferable that the outer circumferential portion 2 be divided in a plurality of parts to widen a range in which the predetermined relationship of the inclination angle θ is satisfied at the boundary 3. The number of parts into which the outer circumferential portion 2 is divided is preferably four or more, and more preferably six or more.

When the outer circumferential portion 2 is divided into four parts, the predetermined relationship of the inclination angle θ can be satisfied at the intersections B1 and B3 between the straight line L1 passing through the center in parallel to the offset direction and the boundary 3, and the intersections B2 and B4 between a straight line L2 orthogonal to the straight line L1 and the boundary 3.

When the predetermined relationship of the inclination angle θ is satisfied at the four intersections B1, B2, B3, and B4, the crystal plane C1 of the central portion 1 and the crystal plane C2 of the outer circumferential portion 2 are distorted to an extent that strain cannot be relieved in the crystal growth process at any position of the circular boundary. Therefore, the first single crystal grown from the central portion 1 and the second single crystal grown from the outer circumferential portion 2 can be prevented from being integrated with each other.

At this time, the inclination angle θ is preferably 2° or more, more preferably 4° or more, and even more preferably 8° or more.

Similarly, when the outer circumferential portion 2 is divided into six parts, the predetermined relationship of the inclination angle θ can be satisfied at six intersections. SiC has a six-fold symmetric crystal structure. Therefore, when the predetermined relationship of the inclination angle θ is satisfied at the six intersections, the first single crystal and the second single crystal can be prevented from being integrated with each other in all orientations having symmetry.

At this time, the inclination angle θ is preferably 2° or more, more preferably 4° or more, and even more preferably 8° or more.

Figure 6:
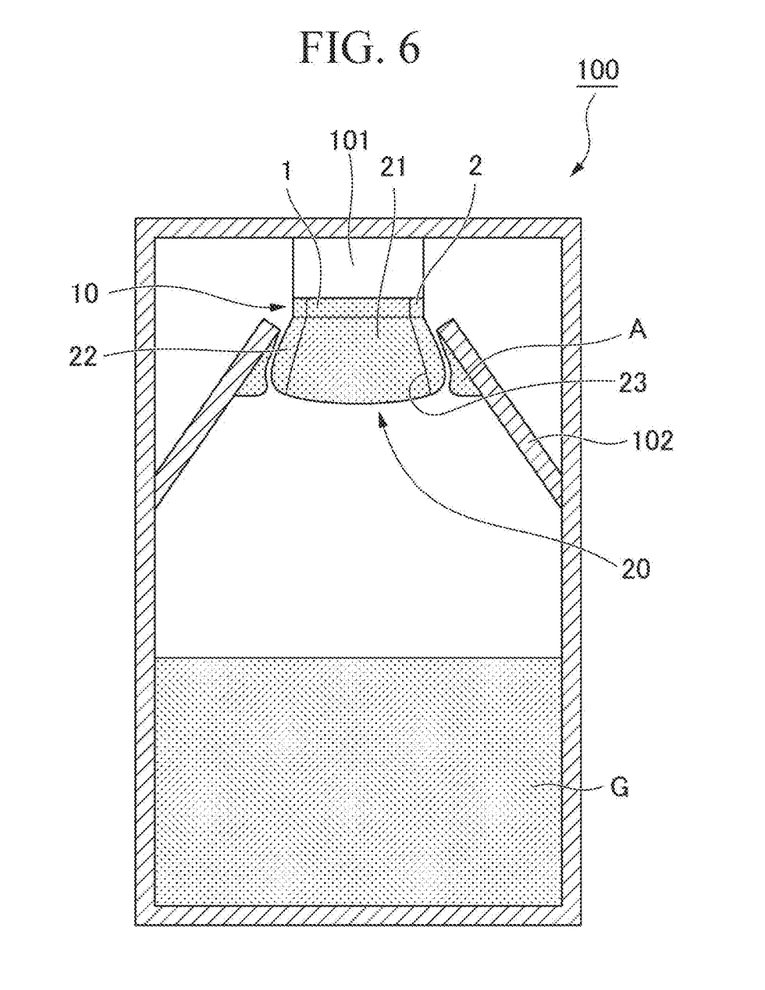
FIG. 6 is a view showing a process of producing a SiC ingot using the SiC single crystal composite as a seed crystal.

Next, advantages of not integrating the first single crystal grown from the central portion 1 and the second single crystal grown from the outer circumferential portion 2 with each other will be described with reference to FIGS. 6 to 8. FIG. 6 is a view showing a process of producing a SiC ingot 20 using the SiC single crystal composite 10 as a seed crystal.

A crucible 100 illustrated in FIG. 6 can store a raw material G in the lower part of the crucible. The crucible 100 includes a crystal installation portion 101 provided at a position facing the raw material G, and a tapered guide 102 which increases in diameter from the crystal installation portion 101 toward the raw material G. The raw material gas generated by heating the raw material G is supplied to the SiC single crystal composite 10 installed on the crystal installation portion 101 along the tapered guide 102. By supplying the raw material gas to the SiC single crystal composite 10, the SiC ingot 20 is grown on the crystal growth surface of the SiC single crystal composite 10.

Figure 7:
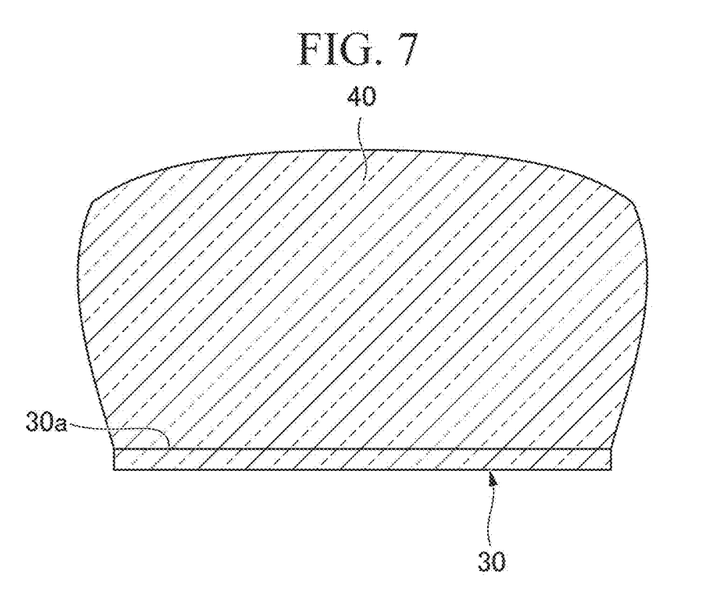
FIG. 7 is a schematic sectional view of a SiC ingot grown on a SiC single crystal of the related art.

FIG. 7 is a schematic sectional view of a SiC ingot 40 grown on a SiC single crystal 30 of the related art. Since the SiC single crystal 30 of the related art is not divided into a central portion and an outer circumferential portion and has a uniform crystal growth surface 30a, the SiC ingot 40 to be grown uniformly grows according to the temperature distribution in the crucible and the amount of the raw material gas supplied. For example, the SiC ingot 40 grows on the crystal growth surface 30a having an offset angle of 4° with respect to the {0001} plane.

As the growth progresses and the length of the crystal increases, the heat insulation effect of the grown crystal itself increases, so that the temperature of the tapered guide decreases. As a result, polycrystals precipitate on the surface of the tapered guide and have an influence on the shape of the end portion of the grown crystal. Due to this influence, defects are easily introduced into the outer circumferential portion of the ingot.

When polycrystals A (see FIG. 6) precipitated on the tapered guide 102 come into contact with the SiC ingot 40 in the crystal growth process, defects, polytype inclusions, cracks, and the like are generated at the contact portions. These defects propagate toward the inside of the SiC ingot 40. Due to this influence, defects are easily introduced to the outer circumferential portion of the ingot, and the quality of the SiC ingot 40 deteriorates.

Figure 8:
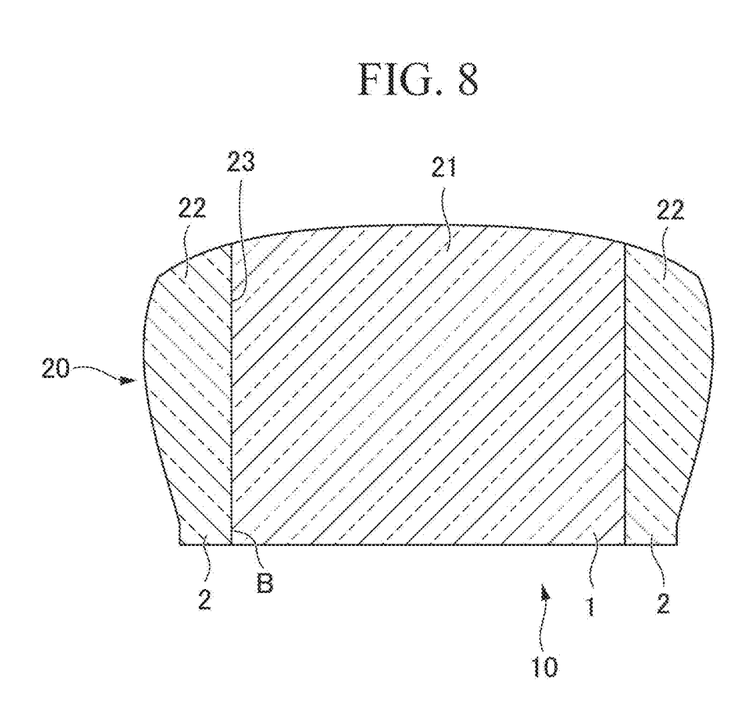
FIG. 8 is a schematic sectional view of the SiC ingot grown on the SiC single crystal composite according to this embodiment.

On the other hand, FIG. 8 is a schematic sectional view of the SiC ingot 20 grown on the SiC single crystal composite 10 according to this embodiment.

The SiC ingot 20 grown on the SiC single crystal composite 10 has the joint portion 23 between the first single crystal 21 grown on the central portion 1 of the SiC single crystal composite 10 and the second single crystal 22 grown on the outer circumferential portion 2. The joint portion 23 is neither a single crystal such as the first single crystal 21 and the second single crystal 22 nor amorphous but is a portion in which crystals having some crystallinity are disturbed.

The direction of the crystal constituting the first single crystal 21 and the direction of the crystal constituting the second single crystal 22 are different from each other with the joint portion 23 as the boundary. That is, when the first single crystal 21 and the second single crystal 22 adjacent to each other with the joint portion 23 as the boundary are compared to each other, continuity as a crystal cannot be confirmed, and the first single crystal 21 and the second single crystal 22 are not integrated with each other. That is, even if the second single crystal 22 present on the outer circumferential side of the SiC ingot 20 comes into contact with the polycrystal A and a defect is generated, since the crystallinity is divided by the joint portion 23, the defect does not propagate to the first single crystal 21.

This can also be confirmed from the surface of the wafer subjected to etching shown in FIG. 4. In FIG. 4, defects D is present in the second single crystal 22. The defects D shown in FIG. 4 are basal plane dislocations (BPDs). The defects D are continuously present in one direction in the second single crystal 22. This is because the basal plane dislocations extend along the (0001) plane. On the other hand, the defects D do not propagate to the first single crystal 21 via the joint portion 23. That is, it can be said that defects in the second single crystal 22 do not propagate to the first single crystal 21.

That is, even if the polycrystals A and the SiC ingot 20 come into contact with each other during the crystal growth process, the generated defects do not propagate to the first single crystal 21 due to the joint portion 23. That is, by cutting out the first single crystal 21 with a wire saw or the like, a high-quality SiC wafer can be obtained.

When the SiC single crystal composite 10 according to this embodiment is used, there is an advantage in that the SiC ingot 20 can be increased in length with high quality.

It is preferable that the boundary 3 of the SiC single crystal composite 10 be provided inward of 5% or more of the diameter of the SiC single crystal composite 10 from the outer circumferential end of the SiC single crystal composite 10. The outer circumferential portion of a crystal is affected by the surroundings as described above, so that defects tend to be introduced thereto. By providing the boundary 3 inward of the outer circumferential end to some extent, defects stay in a portion of the second single crystal and do not reach a portion of the first single crystal. When the boundary 3 is provided in the corresponding range, even in a case of an increase in length, the generation of polytype inclusions and low-angle grain boundaries in the portion of the first single crystal can be prevented. In addition, in order not to significantly reduce the efficiency in obtaining SiC wafers, it is preferable to provide the boundary 3 of the SiC single crystal composite 10 outward of a position inward of 30% of the diameter of the SiC single crystal composite 10 from the outer circumferential end of the SiC single crystal composite 10. The relationship between the position of the boundary B in the SiC single crystal composite 10 and the position of the joint portion 23 is confirmed by prior examination.

As described above, according to the SiC single crystal composite 10 of this embodiment, defects generated by contact between the polycrystals and the SiC ingot in the crystal growth process are prevented from intruding the inside of the SiC ingot 20.

That is, according to the SiC single crystal composite 10 of this embodiment, the SiC ingot having the high-quality first single crystal in the central portion can be obtained, and the high-quality SiC wafer can be obtained by cutting out the first single crystal.

While the SiC single crystal according to the aspect of the present invention has been described above with reference to the drawings, various modifications can be added to the configuration without departing from the gist of the present invention.

(SiC Single Crystal Composite and Manufacturing Method of SiC Ingot)

First, a manufacturing method of the SiC single crystal composite 10 will be described.

The case where the crystal planes of the central portion 1 and the outer circumferential portion 2 of the SiC single crystal composite 10 are different from each other will be described in detail.

First, the center of the SiC single crystal that has been already formed is cut out into a circular shape with a wire saw. For example, in a case where the crystal growth surface of the SiC single crystal that has been already formed is on the (000-1) C plane, the crystal growth surface of the central portion 1 that has been cut out is also on the (000-1) C plane.

The direction of the outer circumferential portion 2 which remains after the cutting out is reversed. The central portion 1 is fitted again into the opening formed by cutting out the central portion 1. Since the direction of the outer circumferential portion 2 is reversed, the crystal growth surface thereof is on the (0001) Si plane.

As described above, by cutting out the central portion 1 from the single SiC single crystal and fitting the cut-out central portion 1 into the outer circumferential portion 2 of which the direction is reversed, the SiC single crystal composite 10 according to this embodiment can be obtained.

Next, the case where the crystal planes of the central portion 1 and the outer circumferential portion 2 of the SiC single crystal composite 10 are inclined to each other will be described in detail.

In this case, as illustrated in FIG. 5, the outer circumferential portion 2 is divided into a plurality of parts. The divided outer circumferential portion 2 is installed so that the predetermined relationship of the inclination angle θ is satisfied at the point of contact with the central portion 1. In addition, by connecting the outer circumference of the central portion 1 to the divided outer circumferential portion 2, the SiC single crystal composite 10 according to this embodiment is obtained.

Subsequently, a single crystal is grown on one surface of the SiC single crystal composite 10 to produce the SiC ingot 20.

As a production method of the SiC ingot 20, a known method such as a sublimation method can be used. For example, by using the crucible 100 illustrated in FIG. 6, the SiC ingot 20 which is increased in diameter can be produced from the SiC single crystal composite 10.

A SiC wafer is obtained from the SiC ingot 20 finally obtained. There are cases where the second single crystal 22 formed on the outer circumferential side of the SiC ingot 20 is in contact with the polycrystal A, and the quality of the crystal is inferior to that of the first single crystal 21.

Therefore, the SiC ingot 20 is processed into a predetermined shape by removing the second single crystal 22 of the SiC ingot 20 using a wire saw or the like. In addition, by slicing the SiC ingot processed into the predetermined shape in the thickness direction, a SiC wafer can be obtained.

REFERENCE SIGNS LIST

1: central portion
1a, 30a: crystal growth surface
1A, 2A: boundary plane
2: outer circumferential portion
3: boundary
10: SiC single crystal composite
20, 40: SiC ingot
21: first single crystal
22: second single crystal
23: joint portion
100: crucible
101: crystal installation portion
102: tapered guide
B, Ba: boundary
B1 to B4: intersection
C1, C2: crystal plane
D: defect
G: raw material

The invention claimed is:
1. A SiC ingot, comprising:
a first single crystal positioned at a center in plan view;
a second single crystal surrounding an outer circumference of the first single crystal; and a joint portion connecting the first single crystal to the second single crystal, wherein a direction of a crystal constituting the first single crystal and a direction of a crystal constituting the second single crystal are different from each other with the joint portion as a boundary, wherein the first single crystal and the second single crystal are different from each other in polytype, and the joint portion is provided inward of 5% or more of a diameter of the SiC ingot from an outer circumferential end of the SiC ingot and provided outward of a position inward of 30% of the diameter of the SiC ingot from the outer circumferential end of the SiC ingot.

\* \* \* \* \*